United States Patent

Neibecker et al.

[11] Patent Number: 5,973,409
[45] Date of Patent: Oct. 26, 1999

[54] ELECTRICAL DISTRIBUTION SYSTEM

[75] Inventors: Niels Neibecker, Cologne; Horst Schubotz, Wuppertal; Peter Stadler, Aurachtal, all of Germany

[73] Assignee: Delco Electronics Corp., Kokomo, Ind.

[21] Appl. No.: 09/037,820

[22] Filed: Mar. 10, 1998

[30] Foreign Application Priority Data

Sep. 8, 1997 [GB] United Kingdom .................... 9718892

[51] Int. Cl.⁶ ..................................................... B60L 1/00
[52] U.S. Cl. ........................................................... 307/10.1
[58] Field of Search ..................................... 307/10.1, 9.1, 307/147; 361/600, 601, 622, 624, 626, 628, 629, 630, 631, 641, 642, 643, 644, 646, 647, 648, 659, 663, 668, 669, 706, 720, 735, 736, 752, 775, 784, 785; 174/72 B

[56] References Cited

U.S. PATENT DOCUMENTS

| | | | |
|---|---|---|---|
| 5,030,108 | 7/1991 | Babow et al. | 439/64 |
| 5,179,503 | 1/1993 | Fouts et al. | 361/729 |
| 5,353,190 | 10/1994 | Nakayama et al. | 361/647 |
| 5,581,130 | 12/1996 | Boucheron | 307/10.1 |
| 5,608,271 | 3/1997 | Saka et al. | 307/10.1 |
| 5,869,907 | 2/1999 | Marler | 307/10.1 |

FOREIGN PATENT DOCUMENTS

0181534 A1  5/1986  European Pat. Off. .

*Primary Examiner*—Jeffrey Gaffin
*Assistant Examiner*—Roberto J. Rios

[57] ABSTRACT

An electrical distribution system in which power distribution and signal distribution functions for a motor vehicle are combined within a single casing, which can be assembled before installation in the vehicle. The casing houses a power distribution board, a signal distribution board, and at least two cards (a switch card and a control card) electrically coupled between the power and signal distribution boards. The power distribution board includes a pair of connectors aligned with suitable openings in the casing for electrically coupling to the battery and electrical loads, and the signal distribution board includes a connector aligned with a suitable opening in the casing for electrically coupling to remote circuits which send and receive electrical signals. The control card carries control circuitry, and the switch card carries switches that are electrically activated by the control circuitry of the control card to the battery to selected electrical loads. The switch card is coupled to the power distribution board through electrical fuses, and the control card is coupled to the power distribution board through switching devices activated by the control card.

12 Claims, 1 Drawing Sheet

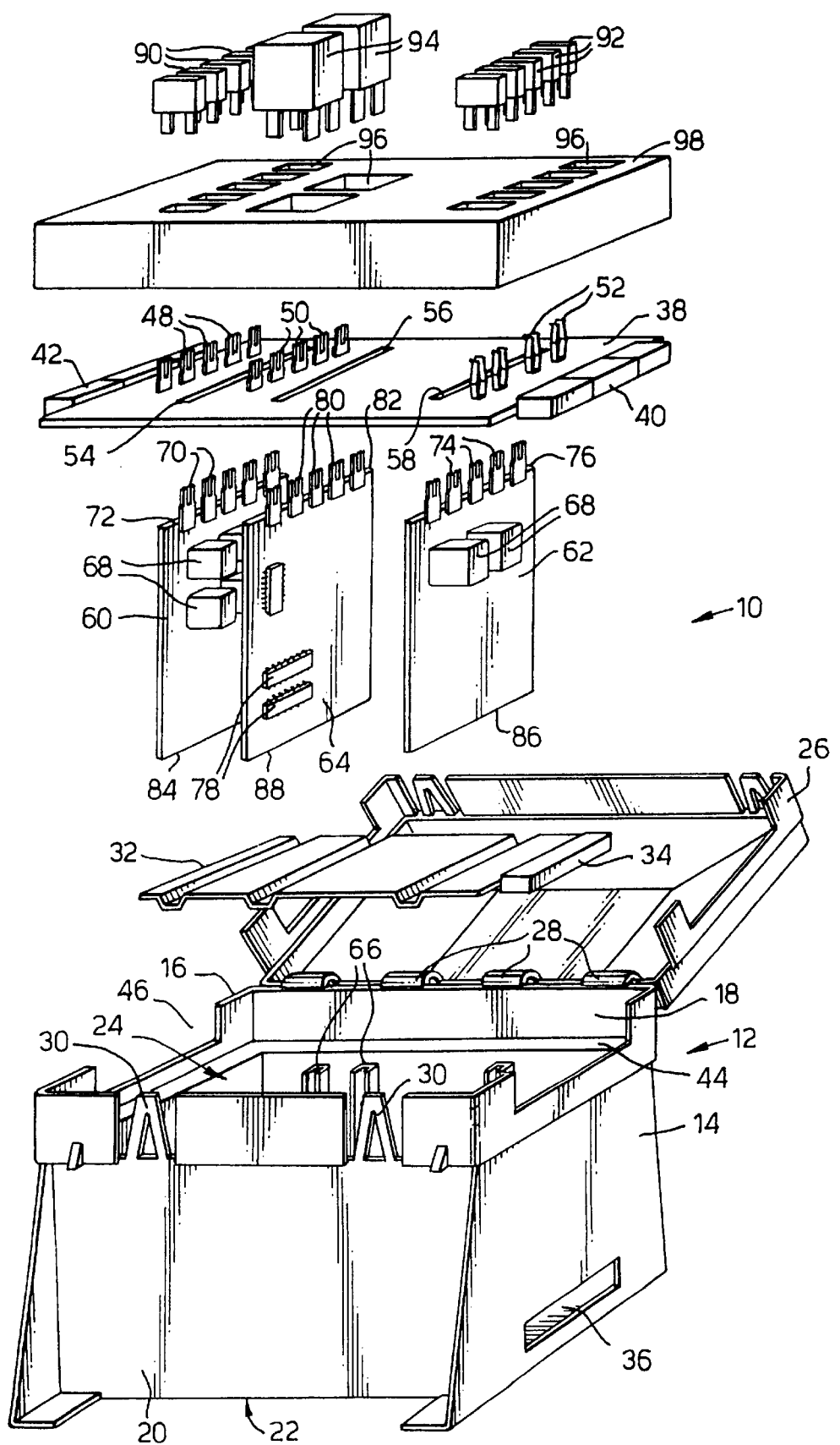

ELECTRICAL DISTRIBUTION SYSTEM

TECHNICAL FIELD

The present invention relates to an electrical distribution system for a motor vehicle which is used for the distribution of both electrical power and electrical signals.

BACKGROUND OF THE INVENTION

Currently, in motor vehicles, electrical power distribution and electrical signal distribution are in general isolated from one another, and/or are provided by numerous separate systems. This leads to complicated wiring harness designs, difficulties in installation in the motor vehicle, and a multitude of system casings and set-ups.

SUMMARY OF THE INVENTION

It is an object of the present invention to simplify the electrical distribution within a motor vehicle.

The present invention provides a modular arrangement for power and signal distribution which reduces wiring harness complexity, provides easier installation in a motor vehicle, and enables a reduction in the number of variants. According to the invention, power distribution and signal distribution functions for a motor vehicle are combined within a single casing which can be assembled before installation in the vehicle. The casing houses a power distribution board, a signal distribution board, and at least two cards (a switch card and a control card) electrically coupled between the power and signal distribution boards. The power distribution board includes a pair of connectors aligned with suitable openings in the casing for electrically coupling to the battery and electrical loads, and the signal distribution board includes a connector aligned with a suitable opening in the casing for electrically coupling to remote circuitry, and the switch card carries switches that are electrically activated by the control circuitry of the control card to couple the battery to selected electrical loads. Preferably, the switch card is coupled to the power distribution board through electrical fuses, and the control card is coupled to the power distribution board through switching devices activated by the control card.

BRIEF DESCRIPTION OF THE DRAWINGS

The present invention will now be described, by way of example, with reference to the accompanying drawing in which the sole figure is an exploded view of an electrical distribution system in accordance with the present invention.

DESCRIPTION OF THE PREFERRED EMBODIMENT

Referring to the sole figure, the electrical distribution system 10 for use in a motor vehicle comprises a casing 12 of electrically insulating material having opposed end walls 14,16; opposed side walls 18,20; a base wall 22; and an open end 24 opposite the base wall. The open end 24 is closable by a cover 26 of electrically insulating material. The cover 26 is preferably attached to one 18 of the side walls of the casing 12 by suitable hinges 28, and can preferably make a snap fit with resilient tabs 30 on the other side wall 20 of the casing 12 to close the open end 24. Any other suitable means for attaching the cover 26 to the casing 12 may be used.

The system 10 further comprises a signal distribution board in the form of a signal distribution board 32 which is secured to the base wall 22 inside the casing 12. The signal distribution board 32 has an electrical connector 34 secured to one end. When positioned inside the casing 12, the electrical connector 34 of the signal distribution board 32 is accessible through an opening 36 in one 14 of the end walls of the casing. The signal distribution board 32 has electrically conductive lines (not shown) formed thereon which connect with electrical contacts (not shown) mounted in the electrical connector 34. The electrical connector 34 is connectable with electrical lines within the motor vehicle for signals being transmitted from and received by the system 10 to electrical components in the vehicle. As an alternative to a flexible printed circuit, the signal distribution board 32 may be a printed circuit board (PCB) or a flexible flat circuit (FFC) or a moulded interconnection device. The signal distribution board may be connected to more than one electrical connector.

The system 10 still further comprises a power distribution board 38 which is secured in the casing 12 near the open end 24. The power distribution board 38 has an electrical connector 40, 42 at either end. When positioned inside the casing 12, each electrical connector 40, 42 of the power distribution board 38 is accessible through an opening 44, 46, respectively, in the adjacent end wall 14, 16 of the casing. Electrical connector 42 is connectable with the vehicle storage battery (not shown). Electrical connector 40 is connectable with electrical loads (not shown) in the motor vehicle. Electrical fuse contacts 48, 52 and relay contacts 50 are mounted on the power distribution board 38. These contacts 48–52 are connected to electrical contacts (not shown) in the electrical connectors 40, 42 by way of electrically conductive lines (not shown) on the board 38. Openings 54, 56, 58 are formed in the board 38 adjacent the contacts 48–52 on the board. The signal distribution board 32 and the power distribution board 38 lie in planes substantially parallel to one another and substantially parallel to the plane of the base wall 22. The power distribution board 38 is preferably a printed circuit board, but may alternatively be formed from stamped metal.

First and second switch cards 60, 62 and a control card 64 extend between the power distribution board 38 and the signal distribution board 32. The cards 60–64 are preferably substantially rigid printed circuit boards which are preferably slidably mounted in grooves 66 formed on the inner surface of the side walls 18, 20 of the casing 12. The first and second switch cards 60, 62 have one or more relays 68 mounted thereon which are electrically connected with electrically conductive lines (not shown) formed on the cards. Electrical fuse contacts 70 are positioned at one end 72 of the first switch card 60 and are connected with the relays 68 on the second card by way of the lines on the card. When the system 10 is assembled, the fuse contacts 70 project through the opening 54 in the power distribution board 38 and align with the fuse contacts 48 adjacent thereto. Electrical fuse contacts 74 are positioned at one end 76 of the second switch card 62 and are connected with the relays 68 on the second card by way of the lines on the card. When the system 10 is assembled, the fuse contacts 74 project through the opening 58 in the power distribution board 38 and align with the fuse contacts 52 adjacent thereto. The control card 64 has one or more microcomputers 78 mounted thereon which are electrically connected with electrically conductive lines (not shown) formed on the card 64. Electrical relay contacts 80 are positioned at one end 82 of the control card 64 and are connected with the microcomputers 78 on the card by way of the lines on the card. When the system 10 is assembled, the relay contacts 80 project through the opening 56 in the power distribution board 38 and align with the relay contacts 50 adjacent thereto. The lines on each card 60-64 extend to the other end 84, 86, 88, respectively, of each card and form edge connectors which contact the lines on the signal distribution board 32. Any other suitable of connection may be made between the cards 60-64 and the signal distribution board 32.

In use, electrical fuses 90 electrically connect the fuse contacts 48 on the power distribution board 38 with the fuse contacts 70 on the first switch card 60; electrical fuses 92 electrically connect the fuse contacts 52 on the power distribution board 38 with the fuse contacts 74 on the second switch card 62; and relays 94 electrically connect the relay contacts 50 on the power distribution board 38 with the relay contacts 80 on the control card 64. The fuses 90, 92 and the relays 94 are preferably positioned in suitable through apertures 96 formed in a casing insert 98 which is positioned in the open end 24 of the casing 12.

After assembly of the components of the system 10 within the casing 12, the cover 26 is pivoted and connected with the tabs 30 to close the open end 24 of the casing.

The relays 68, 94 may be replaced by any other suitable electrically controllable switching devices, such as MOSFETs. The fuses 90, 92 may be replaced by any other suitable overload disconnection system, such as circuit breakers. The microcomputers 78 may be replaced by any other suitable form of logic control device or semiconductor control device. The electrical connectors 34, 40, 42 may be replaced by any other suitable electrical connection means.

With the present invention, power distribution and signal distribution for a motor vehicle can be combined within a casing which can be assembled before installation on a motor vehicle. Power distribution from a vehicle battery to the electrical loads in a vehicle is by way of the power distribution board 38, the fuses 90 and the relays 68, 94. The microcomputers 78 receive and send signals by way the signal distribution board 32 and the fuses 92 to monitor and control the operation of the relays 68, 94, and to monitor and control the operation of other electrical components in the motor vehicle. The present invention therefore provides a modular arrangement for combining power and signal distribution, but maintains isolation between the two distribution systems. Such an arrangement reduces the complexity of vehicle wiring harnesses and provides for easier installation in a motor vehicle.

The present invention also lends itself for easy modification dependent on the vehicle within which the system is to be installed, and dependent on customer requirements for the vehicle, thereby reducing variants.

We claim:

1. An electrical distribution system for a motor vehicle comprising a power distribution board having an electrical connection means for connection to a power supply and an electrical connection means for connection to one or more electrical loads; a signal distribution board having an electrical connection means for receiving and transmitting electrical signals; a switch card extending between, and electrically connectable with, the power distribution board and the signal distribution board, and having electrically operable switch means mounted thereon for switching the power supply between the electrical connection means on the power distribution board; a control card extending between, and electrically connectable with, the power distribution board and the signal distribution board, and having control means mounted thereon for controlling the operation of the switch means dependent on signals received at the electrical connection means on the signal distribution board; and a casing within which the power distribution board, the signal distribution board, the switch card and the control card are mounted, the casing having openings for access to the electrical connection means.

2. An electrical distribution system according to claim 1, wherein electrical fuses provide the electrical connection between the switch card and the power distribution board.

3. An electrical distribution system according to claim 2, wherein the power distribution board has fuse contacts mounted thereon, and the switch card has corresponding fuse contacts which extend through an opening in the power distribution board.

4. An electrical distribution system according to claim 1, wherein electrical relays provide the electrical connection between the control card and the power distribution board.

5. An electrical distribution system according to claim 4, wherein the power distribution board has relay contacts mounted thereon, and the control card has corresponding relay contacts which extend through an opening in the power distribution board.

6. An electrical distribution system according to claim 1, further comprising a second switch card extending between, an electrically connectable with, the power distribution board and the signal distribution board, and having electrically operable switch means mounted thereon for switching the power supply between the electrical connection means on the power distribution board.

7. An electrical distribution system as claimed in claim 6, wherein the electrical fuses provide the electrical connection between the second switch card and the power distribution board.

8. An electrical distribution system according to claim 1, wherein an edge connection provides the electrical connection between signal distribution board and at least one of the switch card and the control card.

9. An electrical distribution system according to claim 1, wherein the signal distribution board is a flexible printed circuit.

10. An electrical distribution system claim 1, wherein the casing comprises a pair of end walls, a pair of side walls, a base wall, and an open end opposite the base wall, the signal distribution board being mounted on the base wall inside the casing, the power distribution board being mounted near the open end, and the openings being in the end walls.

11. An electrical distribution system according to claim 10, wherein the side walls have grooves therein within which at least one of the switch card and the control card make a sliding fit.

12. An electrical distribution system according to claim 10, wherein the open end of the casing is closable by a cover.

* * * * *